US011227075B2

(12) United States Patent
Malkosh et al.

(10) Patent No.: US 11,227,075 B2
(45) Date of Patent: Jan. 18, 2022

(54) PRODUCT DESIGN, CONFIGURATION AND DECISION SYSTEM USING MACHINE LEARNING

(71) Applicant: SWATCHBOOK, Inc., Irvine, CA (US)

(72) Inventors: Yazan W. Malkosh, Laguna Niguel, CA (US); Thomas Teger, Orange, CA (US)

(73) Assignee: SWATCHBOOK, INC., Irvine, CA (US)

( * ) Notice: Subject to any disclaimer, the term of this patent is extended or adjusted under 35 U.S.C. 154(b) by 0 days.

(21) Appl. No.: 16/747,316

(22) Filed: Jan. 20, 2020

(65) Prior Publication Data

US 2020/0242279 A1 Jul. 30, 2020

Related U.S. Application Data

(60) Provisional application No. 62/797,073, filed on Jan. 25, 2019.

(51) Int. Cl.
| | |
|---|---|
| *G06F 30/10* | (2020.01) |
| *G06N 3/04* | (2006.01) |
| *G06N 3/08* | (2006.01) |
| *G06Q 30/06* | (2012.01) |

(52) U.S. Cl.
CPC ............... *G06F 30/10* (2020.01); *G06N 3/04* (2013.01); *G06N 3/08* (2013.01); *G06Q 30/0621* (2013.01)

(58) Field of Classification Search
CPC ..... G06F 30/10; G06F 30/27; G06Q 30/0621; G06N 3/08; G06N 3/04; G06N 20/10; G06N 3/084; G06N 3/0454; G06N 3/126
See application file for complete search history.

(56) References Cited

U.S. PATENT DOCUMENTS

| | | | |
|---|---|---|---|
| 6,628,279 B1 | 9/2003 | Schell et al. | |
| 7,042,453 B2 | 5/2006 | Hatanaka et al. | |
| 7,657,084 B2 | 2/2010 | Ives et al. | |
| 7,924,458 B2 | 4/2011 | Taniuchi et al. | |
| 8,239,268 B2 | 8/2012 | Hanechak | |
| 9,305,390 B2 | 4/2016 | Schlichte et al. | |
| 9,348,967 B2 | 5/2016 | Batra | |
| 9,576,351 B1* | 2/2017 | Barzel | G06T 11/60 |
| 9,734,264 B2 | 8/2017 | Iverson et al. | |

(Continued)

*Primary Examiner* — Stephen S Hong
*Assistant Examiner* — Ahamed I Nazar
(74) *Attorney, Agent, or Firm* — Olav M. Underdal; IDP Patent Services

(57) ABSTRACT

A product configuration design system, includes a product configuration design server, including a processor, a non-transitory memory, an input/output, a product storage, a configuration library, and a machine learner; and a product configuration design device, which enables a user to select a three-dimensional object representation, a collection, and an inspiration source, such that the product configuration design server generates a plurality of product configurations as an output from a machine learning calculation on a configuration generation model, which takes as input the three-dimensional object representation, the collection, and the inspiration source. Also disclosed is a method of selecting a three-dimensional object representation, a collection, and an inspirations source; and generating product configurations.

11 Claims, 16 Drawing Sheets

Application View for Accepting or Rejecting Configuration Results

(56) References Cited

U.S. PATENT DOCUMENTS

| | | |
|---|---|---|
| 9,773,302 B2 | 9/2017 | Wang et al. |
| 2005/0219244 A1 | 10/2005 | Weiss |
| 2006/0064288 A1 | 3/2006 | Ferryanto et al. |
| 2012/0010739 A1 | 1/2012 | Elisma |
| 2013/0231768 A1 | 9/2013 | Jensen et al. |
| 2014/0114620 A1 | 4/2014 | Grinspun et al. |
| 2014/0267308 A1 | 9/2014 | Mcnerney et al. |
| 2014/0344013 A1* | 11/2014 | Karty .............. G06Q 30/0201 705/7.29 |
| 2015/0055085 A1* | 2/2015 | Fonte .............. H04N 5/23219 351/178 |
| 2015/0066189 A1 | 3/2015 | Mulligan et al. |
| 2015/0154322 A1 | 6/2015 | Fonte et al. |
| 2015/0269785 A1 | 9/2015 | Bell et al. |
| 2015/0324490 A1* | 11/2015 | Page ............... G06Q 30/0621 700/98 |
| 2017/0177991 A1 | 6/2017 | Bogue et al. |
| 2017/0316004 A1 | 11/2017 | Osotio et al. |
| 2018/0025547 A1 | 1/2018 | Alun-Jones et al. |
| 2018/0143756 A1 | 5/2018 | Mildrew et al. |
| 2018/0357694 A1 | 12/2018 | Stein et al. |
| 2019/0056715 A1 | 2/2019 | Subramaniyan et al. |
| 2019/0220746 A1* | 7/2019 | Liu ..................... G06K 9/6262 |
| 2019/0325628 A1* | 10/2019 | Dubey .............. G06F 16/3329 |
| 2020/0117348 A1* | 4/2020 | Jang ................. G06T 11/001 |

\* cited by examiner

Product Configuration Design Device

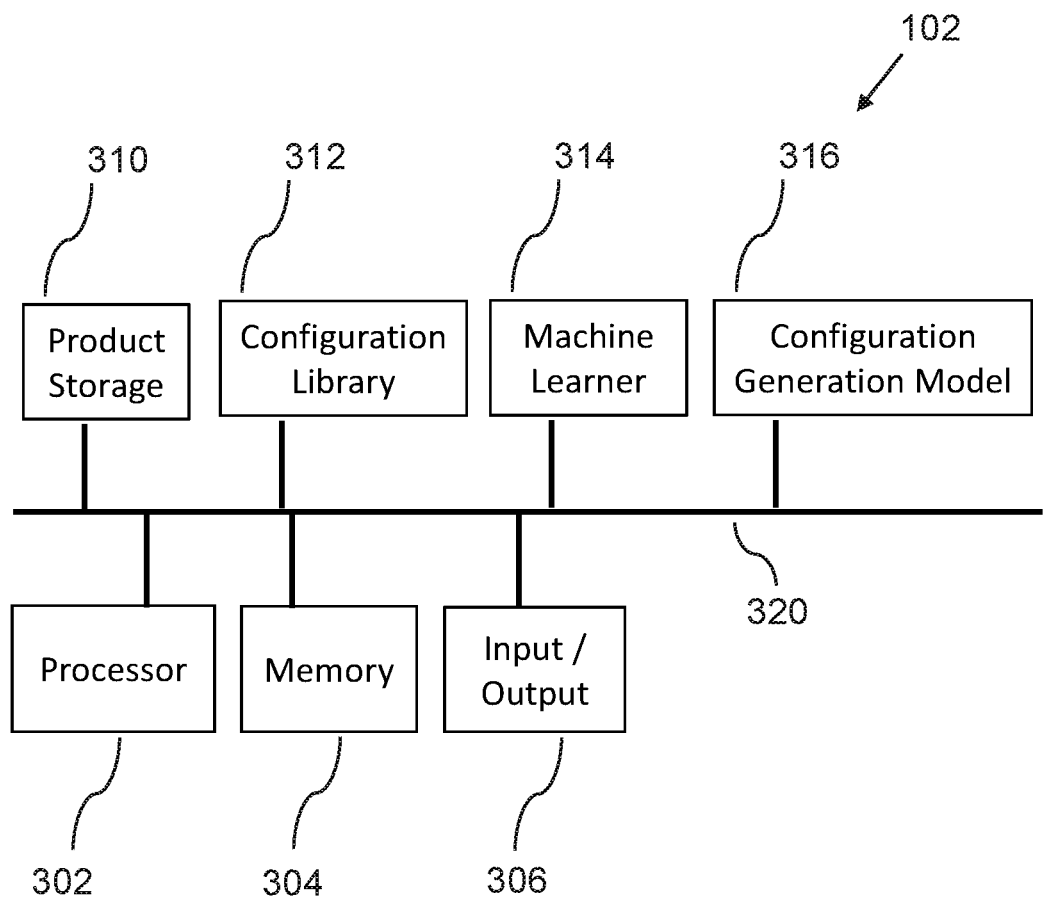

Application View for 3D Object Selection

Application View for Selection of a Collection

Application View for Selection of a Source of Inspiration

Application View for Creating Configurations

Application View for Accepting or Rejecting Configuration Results

Application View for Accepting or Rejecting Configuration Results

Application View for Reviewing Results

Application View for Manipulating Results

Application View for Reviewing Saved Configurations

Application View for Smart Tag Creation

Application View for A/R Presentation of Configuration

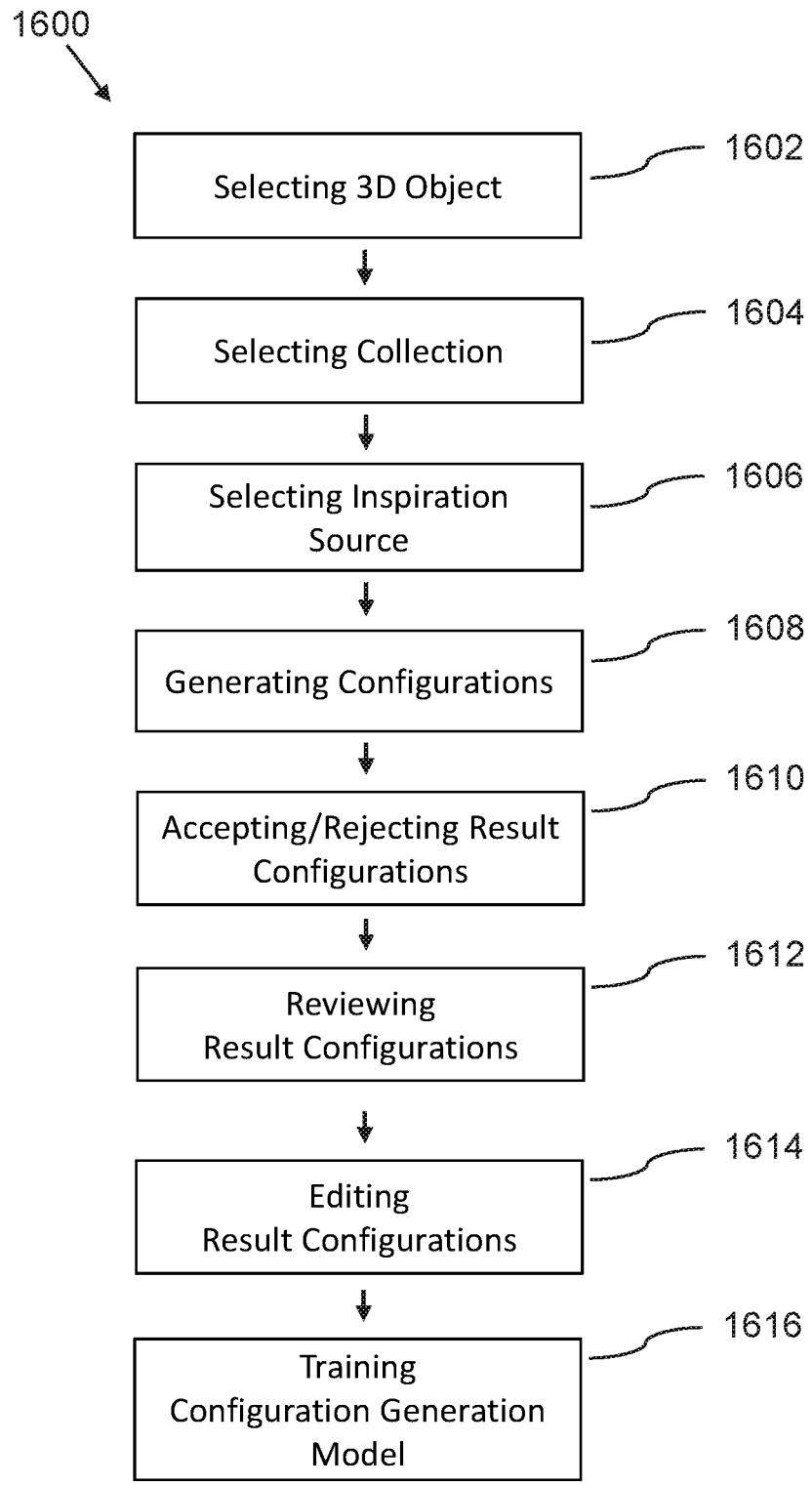

PRODUCT DESIGN, CONFIGURATION AND DECISION SYSTEM USING MACHINE LEARNING

CROSS-REFERENCE TO RELATED APPLICATIONS

This application claims the benefit of U.S. Provisional Application No. 62/797,073, filed Jan. 25, 2019; which is hereby incorporated herein by reference in its entirety.

FIELD OF THE INVENTION

The present invention relates generally to the field of three-dimensional product design, and more particularly to methods and systems for machine-learning and artificial intelligence based product design using a set of selected colors and materials for the creation of material and color combinations on a 3D object, driven by input from stored personal images and content collections, external social media, photo libraries, and other containers of personal visual information.

BACKGROUND OF THE INVENTION

The creation of visual representations of 3D objects along with various configurations using different color and material combinations has been around for quite some time. From a consumer facing standpoint, many products nowadays can be configured through an online configurator. On the design side during the product development process, the concept of configurators enables designers to present and make design decisions while being able to visualize the product in a photorealistic representation under 3D lighting conditions, even with the use of VR and AR has been explored for several years.

When looking at using configurators as part of the actual design process, in particular through the exploration phase of the design process, only few solutions are available and of those that are being offered, the user experience is lacking when it comes to setting up configurations. Furthermore, this process is largely driven by manual interaction, pulling inspiration from many sources stored in various media, and is limited by the amount of time and resources the designer has available to explore many alternatives. Any design decisions that have been made on color and material configurations are stored in a traditional way, either digitally or manually in form of print or physical sample.

However, while these decisions serve as references and as such can aid as input for the next design cycle, there is currently no smart way of reusing past design decisions and being able to combine this efficiently with trend and mood data captured in digital or yet again physical form. All of this input relies on human interaction, requiring for an individual to analyze the data and translate that into next generation design proposals.

As such, considering the foregoing, it may be appreciated that there continues to be a need for novel and improved devices and methods for presenting digital representations of materials via methods of product visualization.

SUMMARY OF THE INVENTION

The foregoing needs are met, to a great extent, by the present invention, wherein in aspects of this invention, enhancements are provided to the existing model of product visualization.

In an aspect, the product configuration design system allows designers to use Artificial Intelligence (AI) and Machine Learning (ML) for designing and configuring materials and colors on 3D objects, while teaching the system to make better and more targeted design decisions in the future.

In a related aspect, the product configuration design system can use machine learning/AI to help designers to parse/scan/crawl large databases of materials and colors based on personal mood and trend boards, and personal or public collections of images and photos on social media sites such as PININTEREST™, INSTAGRAM™ and FACEBOOK™. AI will present the designer with potentially large amount of combinations which is primarily driven by the amount of input the application can draw from.

In related aspects, the product configuration design system provides an intuitive decision-making system, which through simple left or right swiping, or tapping, allows the designer to keep or dismiss configurations. Machine Learning will be able to smartly evolve for a narrowed, more targeted offerings of design configurations. Machine Learning is further taught by input from other people with whom design is being shared with, allowing not only to capture the configuration itself, but also demographics, gender, age and potentially more. Once the machine has acquired critical mass, it will then allow designers to use AI to further drive the design with additional input parameters including age, gender, and demographics. The result are not static images, but rather three-dimensional, configured objects that can be viewed interactively in a 3D viewer, as well as AR, under various lighting conditions, to give a photorealistic representation of the design.

In another related aspect, design configurations can be further refined through manual interaction by locking certain parts of the object to prevent changes, as well as visualized with additional design elements such as graphic print and trim.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. In addition, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 3 is a schematic diagram illustrating a product configuration design server, according to an embodiment of the invention.

FIG. 16 is a flowchart illustrating steps that may be followed, in accordance with one embodiment of a method or process of product visualization.

DETAILED DESCRIPTION

Figure 1:
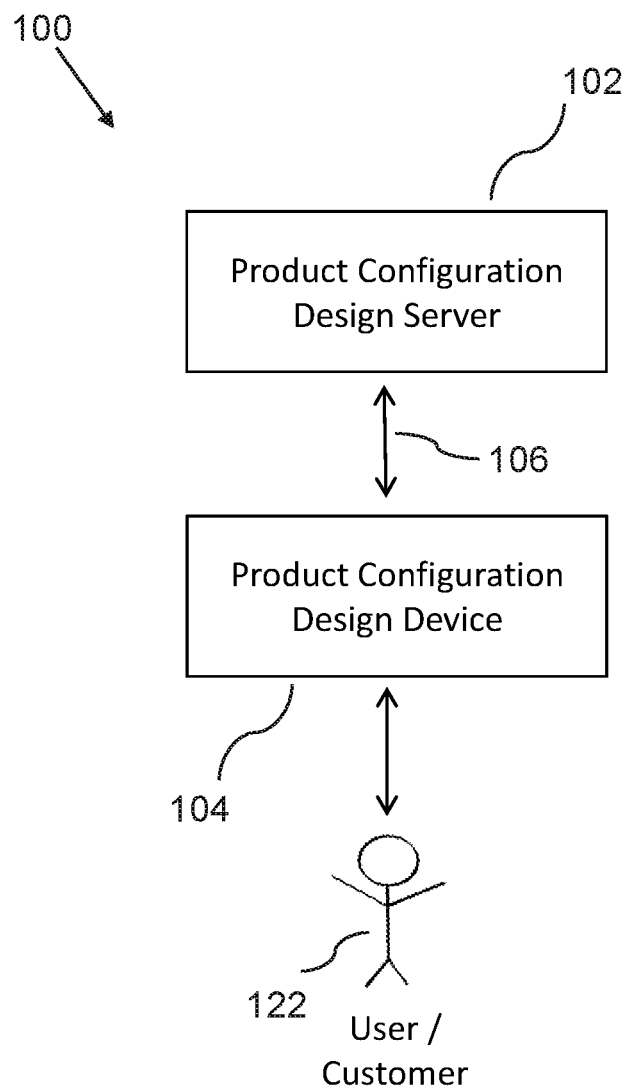
FIG. 1 is a schematic diagram illustrating a product configuration design system, according to an embodiment of the invention.

Before describing the invention in detail, it should be observed that the present invention resides primarily in a novel and non-obvious combination of elements and process steps. So as not to obscure the disclosure with details that will readily be apparent to those skilled in the art, certain conventional elements and steps have been presented with lesser detail, while the drawings and specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive.

In the following, we describe the structure of an embodiment of a product configuration design system 100, with reference to FIG. 1, in such manner that like reference numerals refer to like components throughout; a convention that we shall employ for the remainder of this specification.

In various embodiments, the product configuration design system 100 provides a novel way of automatically configuring materials and color combinations on a 3D product from a cloud-based material library synced to a local device that is being fed through an AI engine that looks at personal mood boards stored inside the application, and image collections saved in social media applications. These AI generated configurations can be either fully automated or follow the input of the user who can determine which parts of the 3D object are being automatically configured. AI can further be used to apply materials in a smart way by processing material properties and tags, as well as the object's layers, to determine which type of material goes to what part of the object. All resulting configurations can be viewed interactively in 3D under real world-lighting conditions, as well as AR. Upon review of the AI generated results by the user inside the app and by sharing with people outside the organization users can accept or reject the presented combinations. This will teach the system through Machine Learning and as such make the AI engine smarter when it comes to the configuration of future products. This will result in capturing and analyzing trend data, not just based on color and materials, but also based on gender, age, demographics and more, allowing for more target-driven design in the future.

In other related embodiments, a product configuration design system automatically configures materials and color combinations on a three-dimensional object from a material library provided by a machine learning engine that parses personal mood boards stored in the device, and image collections saved in social media applications. These AI generated configurations can be either fully automated or follow the input of the user who can determine which parts of the 3D object are being automatically configured. AI can further be used to apply materials in a smart way to by processing material properties and tags, as well as the object's layers, to determine which type of material goes to what part of the object. AI generated results can be accepted or rejected, such that machine learning is used to train the system, resulting in capturing and analyzing trend data, based on color and materials, gender, age, demographics, allowing for target-driven design of future collections.

In an embodiment, as shown in FIG. 1, a product configuration design system 100 can include:

a) a product configuration design server 102, comprising a configuration generation model 316; and b) a product configuration design device 104, such that the product configuration design device 104 can be connected to the product configuration design server 102;

wherein the product configuration design device 104 is configured to enable a user to select a three-dimensional object representation 400c, a collection 610, and an inspiration source 710;

such that the product configuration design server 102 generates a plurality of product configurations 810 as an output from a machine learning calculation on the configuration generation model 316, which takes as input the three-dimensional object representation 400c, the collection 610, and the inspiration source 710.

Figure 2:
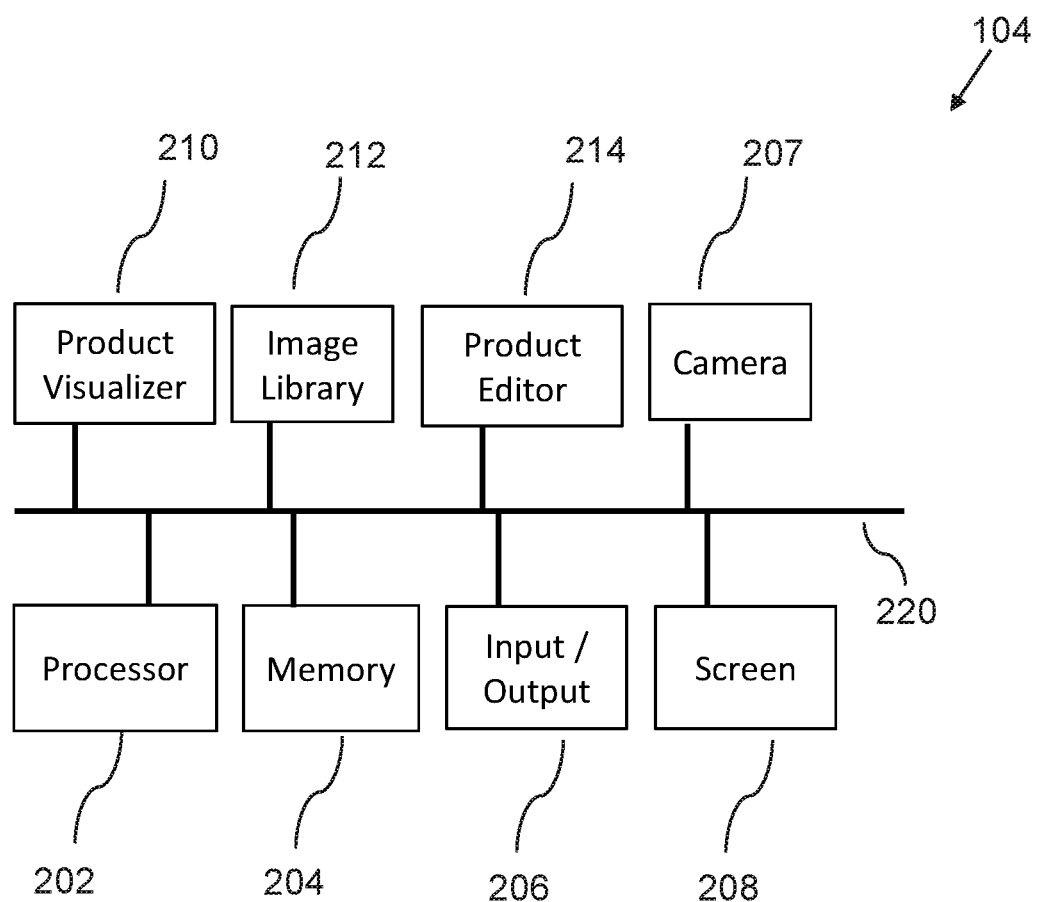
FIG. 2 is a schematic diagram illustrating a product configuration design device, according to an embodiment of the invention.

In a related embodiment, as shown in FIG. 2, a product configuration design device 104 can include:
a) a processor 202;
b) a non-transitory memory 204;
c) an input/output 206;
d) a camera 207;
e) a screen 208;
f) a product visualizer 210;
g) an image library 212; and
h) a product editor 214; all connected via
i) a data bus 220.

In a related embodiment, a product configuration design server 102 can include:
a) a processor 302;
b) a non-transitory memory 304;
c) an input/output component 306;
d) a product storage 310, for storing a customizable tagging system, comprising a hierarchy of tags, such that each tag is associated with at least one three-dimensional object;
e) a configuration library 312, for storing product configurations; and
f) a machine learner 314, which uses/processes a machine learning algorithm for training and executing a configuration generation model 316. The machine learning algorithm can use well-known methods of machine learning, including artificial neural networks, such as deep learning feed-forward neural networks with back-propagation learning, genetic algorithms; support vector machines, and cluster classification; all connected via
g) a data bus 320.

In a further related embodiment, the machine learning algorithm can be a convolutional artificial neural network with at least two hidden layers, such that the configuration generation model is implemented by the optimized/trained convolutional artificial neural network, which can be trained/optimized using well-known artificial neural network deep learning methods, including backpropagation and other non-linear function optimization methods. In many related embodiments, learning/training can be unsupervised, in order to ensure hidden/unknown rating bias is found/incorporated, but in some embodiments, learning may be supervised or partially supervised, and may employ reinforcement learning.

In related embodiments, the product configuration design device 104 can include configurations as:
a) a mobile app, executing on a mobile device, such as for example an ANDROID™ or IPHONE™, or any wearable mobile device;
b) a tablet app, executing on a tablet device, such as for example an ANDROID™ or IOS™ tablet device;
c) a web application, executing in a Web browser;
d) a desktop application, executing on a personal computer, or similar device; or
e) an embedded application, executing on a processing device, such as for example a smart TV, a game console or other system.

It shall be understood that an executing instance of an embodiment of the product configuration design system 100, as shown in FIG. 1, can include a plurality of product configuration design devices 104, which are each tied to one or more users 122.

An executing instance of an embodiment of the product configuration design system 100, as shown in FIG. 1, can similarly include a plurality of product configuration design servers 102.

In related embodiments of the product configuration design system 100, functions provided by the product configuration design device 104 in communication with the product configuration design server 102 will be disclosed in the following with reference to particular application views of the graphical user interface of the product configuration design device 104.

Figure 5:
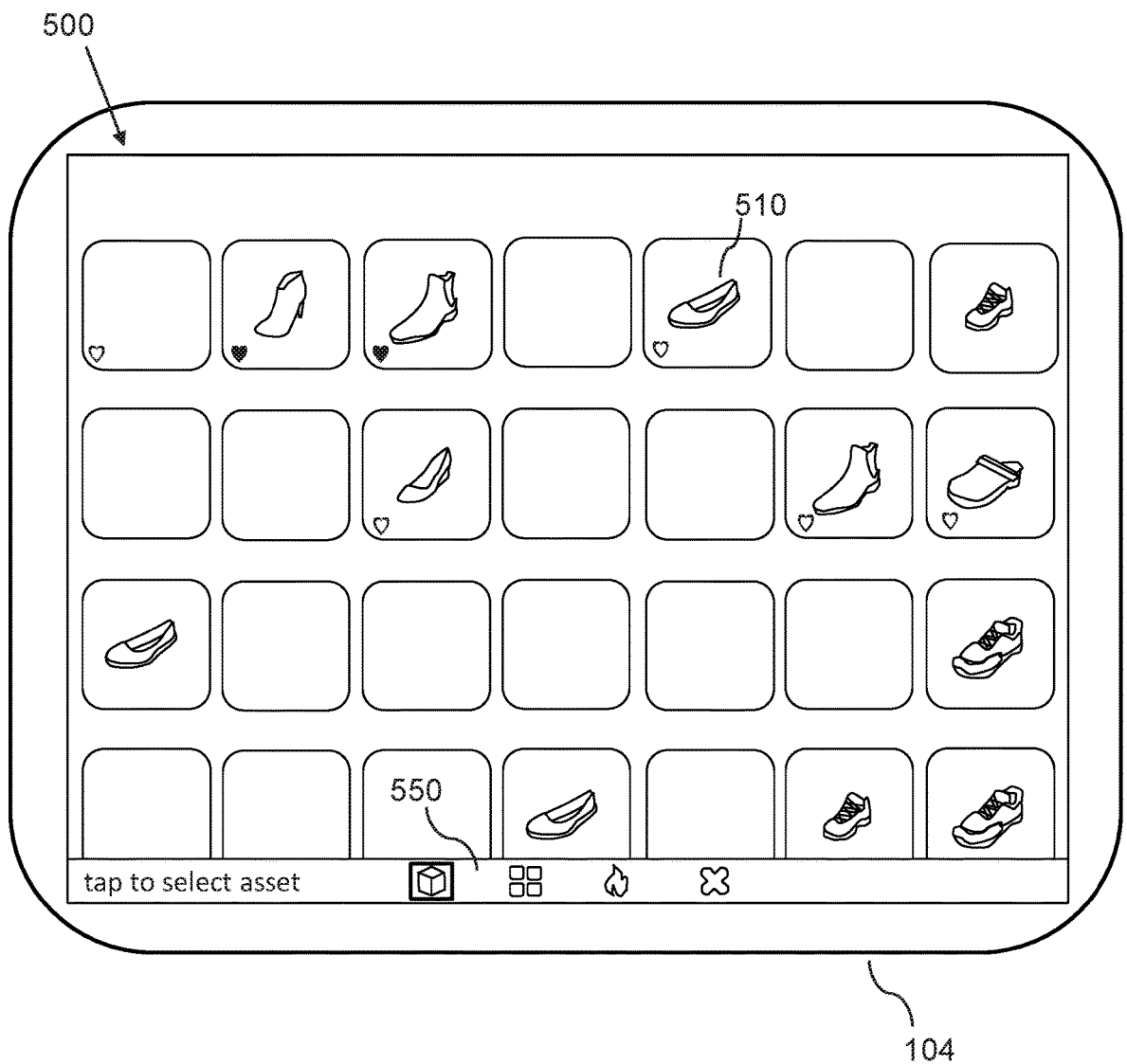
FIG. 5 is an illustration of a graphical user interface of the product configuration design device, according to an embodiment of the invention.

In further related embodiments, as seen in the graphical user interface illustrated, the user 122 can be guided along the setup process through icons in the bottom tool bar, as for example seen in FIG. 5. As soon as the current step is satisfied the next step will become available. This will be indicated by the change in the color of the icon of the next step. Use of Artificial intelligence and Machine Learning is an integral part of the product configuration design system 100 and will described where applicable.

Figure 4A:
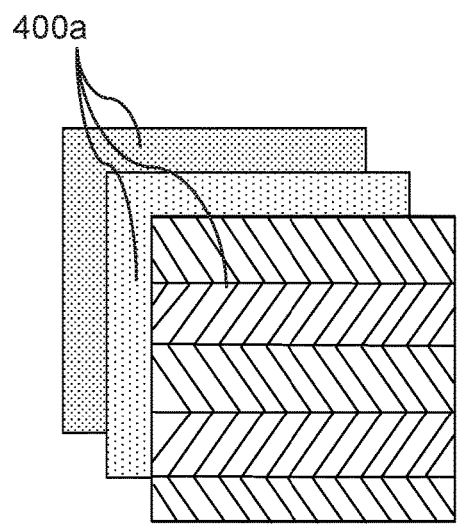
FIG. 4A is an illustration of physical material samples of the product configuration design system, according to an embodiment of the invention.
Figure 4B:
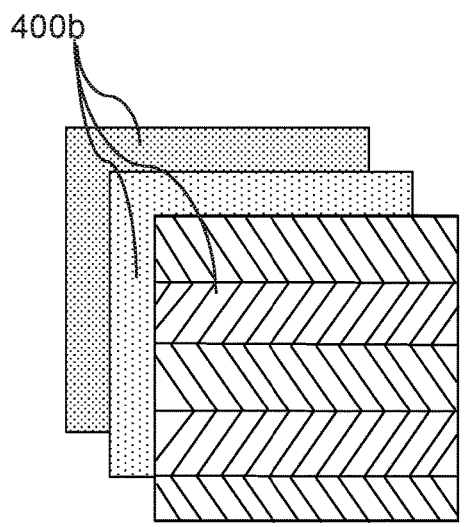
FIG. 4B is an illustration of a digital material representation of the product configuration design device, according to an embodiment of the invention.
Figure 4C:
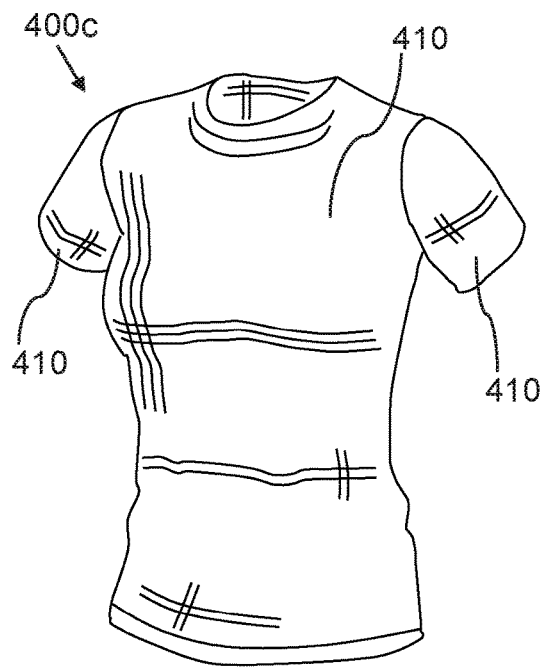
FIG. 4C is an illustration of a three-dimensional digital object of the product configuration design device, according to an embodiment of the invention.

In further related embodiments, in order to facilitate use of AI/machine learning, such that layers or portions of 3D objects 400c, as shown in FIGS. 4A, 4B, and 4C, can be either named or tagged accordingly, such that digital material representations 400b corresponding to physical samples 400a can be mapped to the individual layers, and end results can be subject to machine learning using the corresponding tags. Digital material representations 400b can be tagged to indicate the use of the material in the 3D object. This way the generated configurations are "smart" configurations from the beginning and can aid in Machine Learning. AI and ML may also use visual analysis to automatically recognize where to place materials & graphics.

In a related embodiment, as shown in FIG. 5, the product editor 214 can be configured to provide a graphical user interface 500 for selecting a three-dimensional object 510, as a first step in a product configuration process. The toolbar 550 on the bottom guides the user along in the process. The product editor 214 can be configured to show the 3D objects 510 that are available to be used for configuration.

In a further related embodiment, the product editor 214 can be configured to start the process of creating configurations driven by Artificial Intelligence (AI), based on an initial 3D model 400c 510. The 3D model 400c 510 can include individual layers 410 or portions 410 that can be configured. The 3D objects 400c can be stored locally on the product configuration design device 104, and can be retrieved, uploaded, synchronized in communication with the product configuration design server 102, which can be cloud-based. The user browses through all available assets and selects the object 400c with which s/he wants to work. In order to accept an asset 510, the user 122 swipes left, in order to reject and therefore remove an asset from a collection, the user swipes right. Once the 3D asset 510 is selected, the next step will become available.

Figure 6:
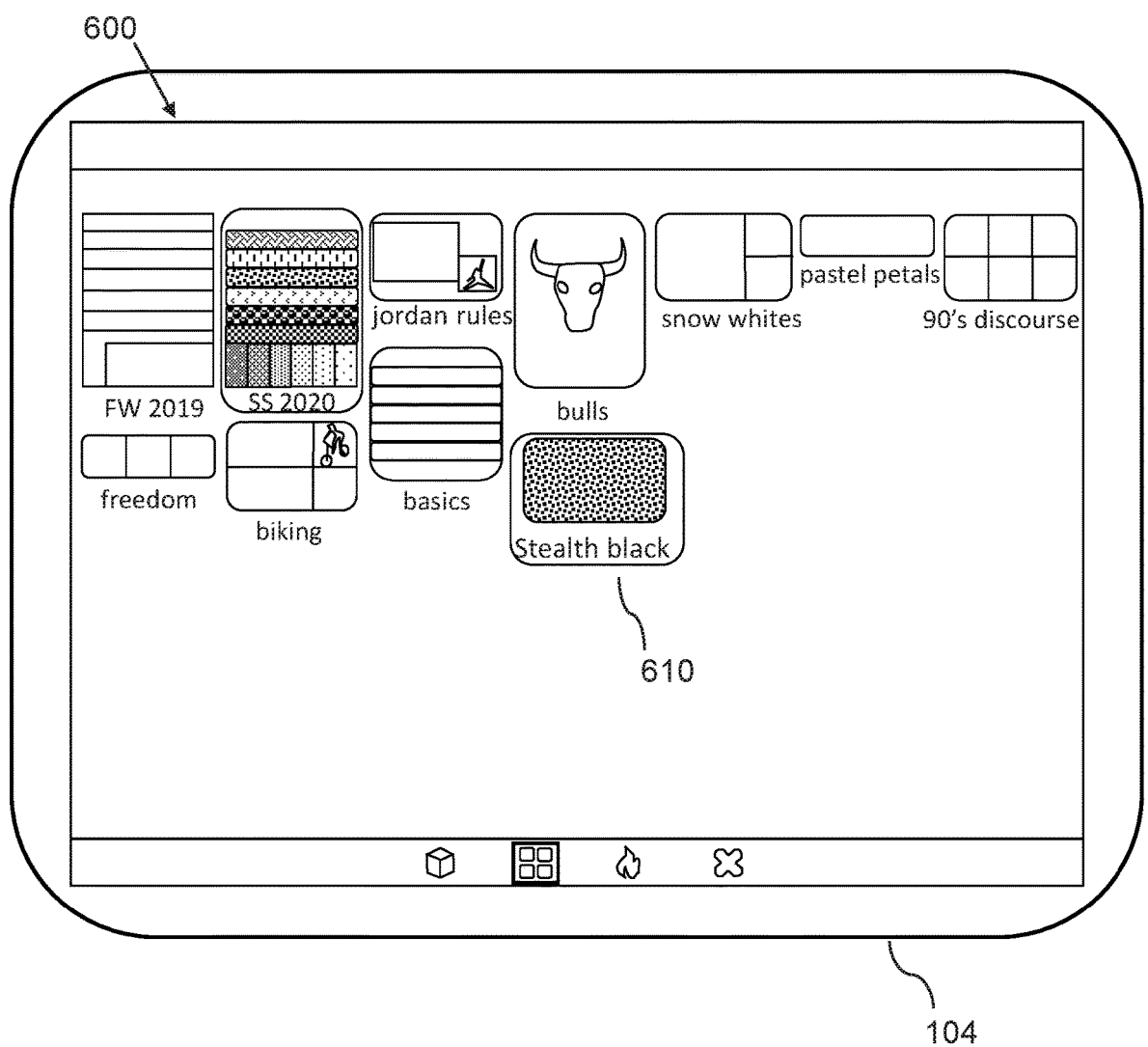
FIG. 6 is an illustration of a graphical user interface of the product configuration design device, according to an embodiment of the invention.

In a related embodiment, as shown in FIG. 6, the product editor 214 can be configured to provide a graphical user interface 600 for displaying and selecting the collections 610 that are available to be used for the AI driven configurations. Collections contain materials, colors and graphics. All configurations can be synced with the product configuration design server 102 (i.e. online platform/backend) and copied locally to the product configuration design device 104.

In a further related embodiment, collections 610 can include materials and colors, for example for the next season. These collections 610 are usually prepared by a team of designers and can be as large as the user chooses. A collection 610 can also include an entire online collection from an approved vendor in combination with any color palette (such as PANTONE™ Color or other color schemes) as input for the application to draw from when creating configurations. Alternatively, the selection of materials can be instigated directly from the inspiration content fed into the AI & ML processing, provided by the machine learning component 314 of the product configuration design server 102.

In a related embodiment, a collection 610 can include a plurality of materials 400b and a plurality of colors.

Figure 7:
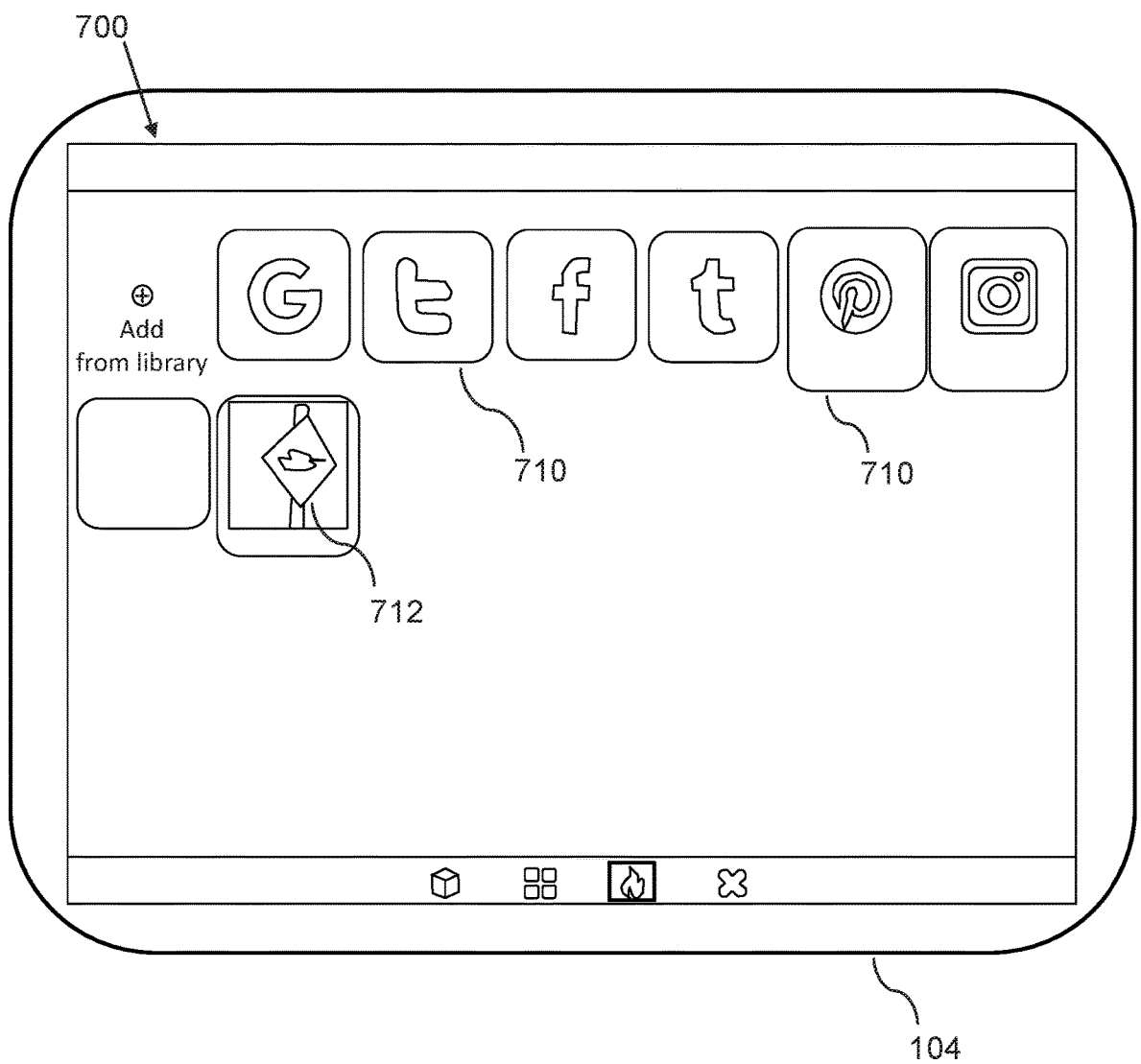
FIG. 7 is an illustration of a graphical user interface of the product configuration design device, according to an embodiment of the invention.

In another related embodiment, as shown in FIG. 7, the product editor 214 can be configured to provide a graphical user interface 700 for selecting the inspiration source 710, as a third step in the setup. The user selects the inspiration source 710, which should be used to create the configurations using the materials and colors as selected in the graphical user interface 600 for displaying and selecting the collections 610.

In a further related embodiment, the inspiration source 710, as shown in FIG. 7, can come from various sources 710. The machine learning component 314 of the product configuration design server 102 can be configured to process the select source, which may be a custom user collection often described as a "mood" or "trend" board, or other online collections of images such as PININTEREST™, INSTAGRAM™, FACEBOOK™ and more. The machine learning component 314 will take the individual or public boards, depending on what the user selects as input. In some cases, users may choose public data and in other cases they may log into their personal account and use private data.

In a related embodiment, the inspiration source 710 can include a plurality of images 712.

Figure 8:
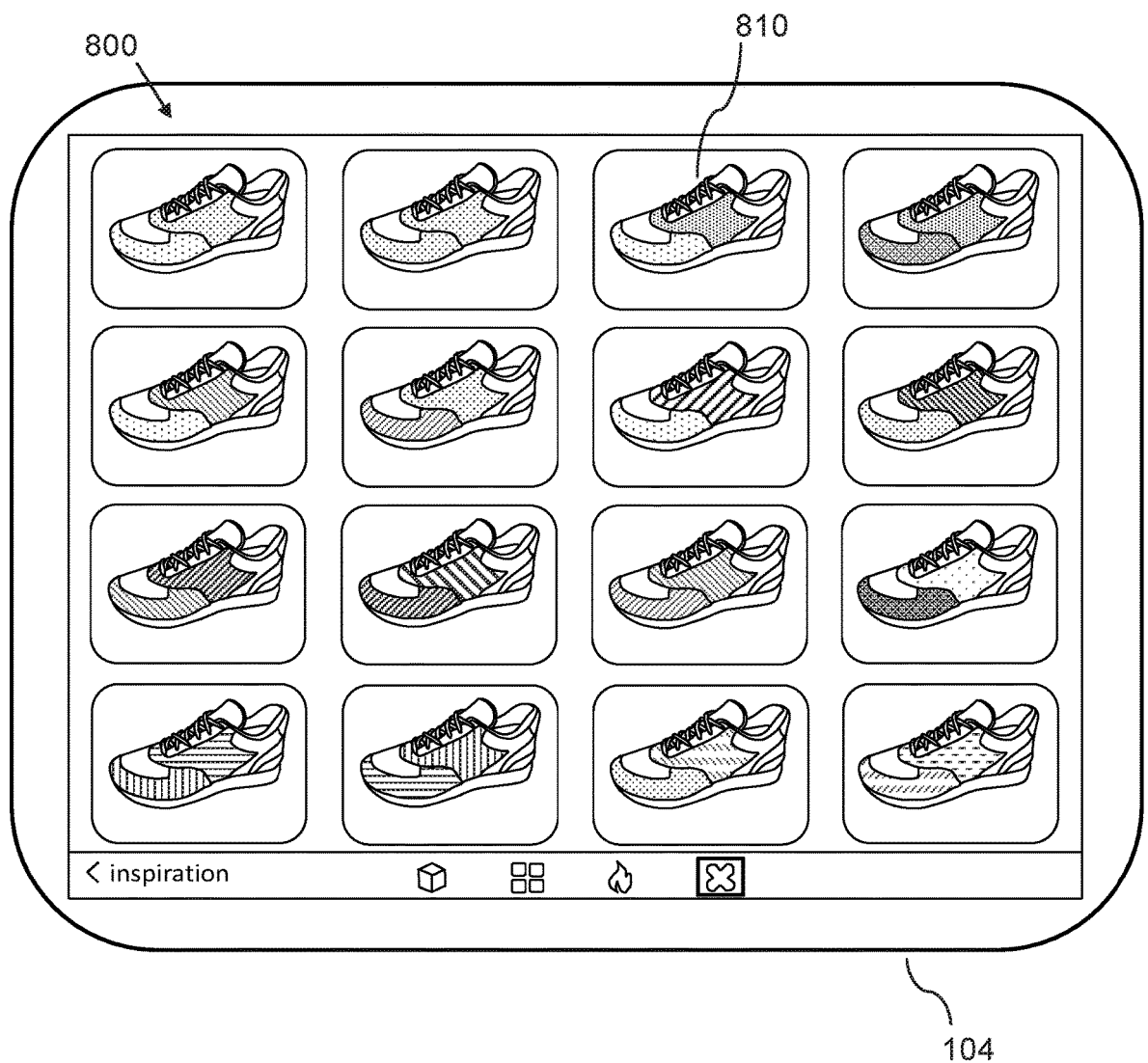
FIG. 8 is an illustration of a graphical user interface of the product configuration design device, according to an embodiment of the invention.

In a related embodiment, as shown in FIG. 8, the product editor 214 can be configured to provide a graphical user interface 800 for creating configurations (mixing configurations), reviewing the results, and changing input, and can include:
  a) Creating configurations, wherein the machine learner 314 can be configured to create configurations 810 using deep learning artificial intelligence algorithms by placing materials from the selected collection and the input from the inspiration source 710 on the selected three-dimensional object 400c 510. The machine learner 314 can be configured to process colors and color combinations, and identify similar objects and analyze colors to select materials and colors and assign them to the individual layers/portions 410 of the selected 3D object 400c 510. In addition, materials can be selected and assigned based on their area of use, such as rubber for soles, liner. Material and color assignments may result in new combinations that are not yet available as a material. The new combinations may be submitted as new material requests to the suppliers directly from within the product configuration design system 100.
  b) Reviewing the results, wherein the product visualizer 210 can be configured to display the resulting configurations, for example in a grid of 4 by 4 configurations. The machine learner 314 can execute a remixing of the content to show sixteen new configurations.
    All configurations are being generated locally on the product configuration design device 104. The results are being displayed in a grid form (16, 4, 21, 8), showing the detail of each configuration including visual representation and other relevant information if desired, such as overall material cost, for example. Each configuration can be opened in the interactive 3D real-time window for in depth review as shown further in FIG. 11. Additional information that will be available for each configuration is a detailed bill of materials. More configurations can be available by scrolling to the next page.
  c) Changing input, wherein the product editor 214 can be configured to allow the user 122 to go back and revisit any of the 3 selections made in previous application steps corresponding to views 500, 600, and 700, by simply clicking on the corresponding icon in the bottom toolbar.
    At any point in time results can be recalculated by changing the input parameters. By clicking onto the icons on the bottom tool bar the user can step back and change the original 3D object 400c 510, or the collection 610, or the inspiration source 710.

In a related embodiment, each configuration in the plurality of configurations can include, the three-dimensional object representation 400c, which comprises a plurality of regions 410, such that for each region 410 a corresponding material representation 400b with a corresponding color combination is applied.

Figure 9:
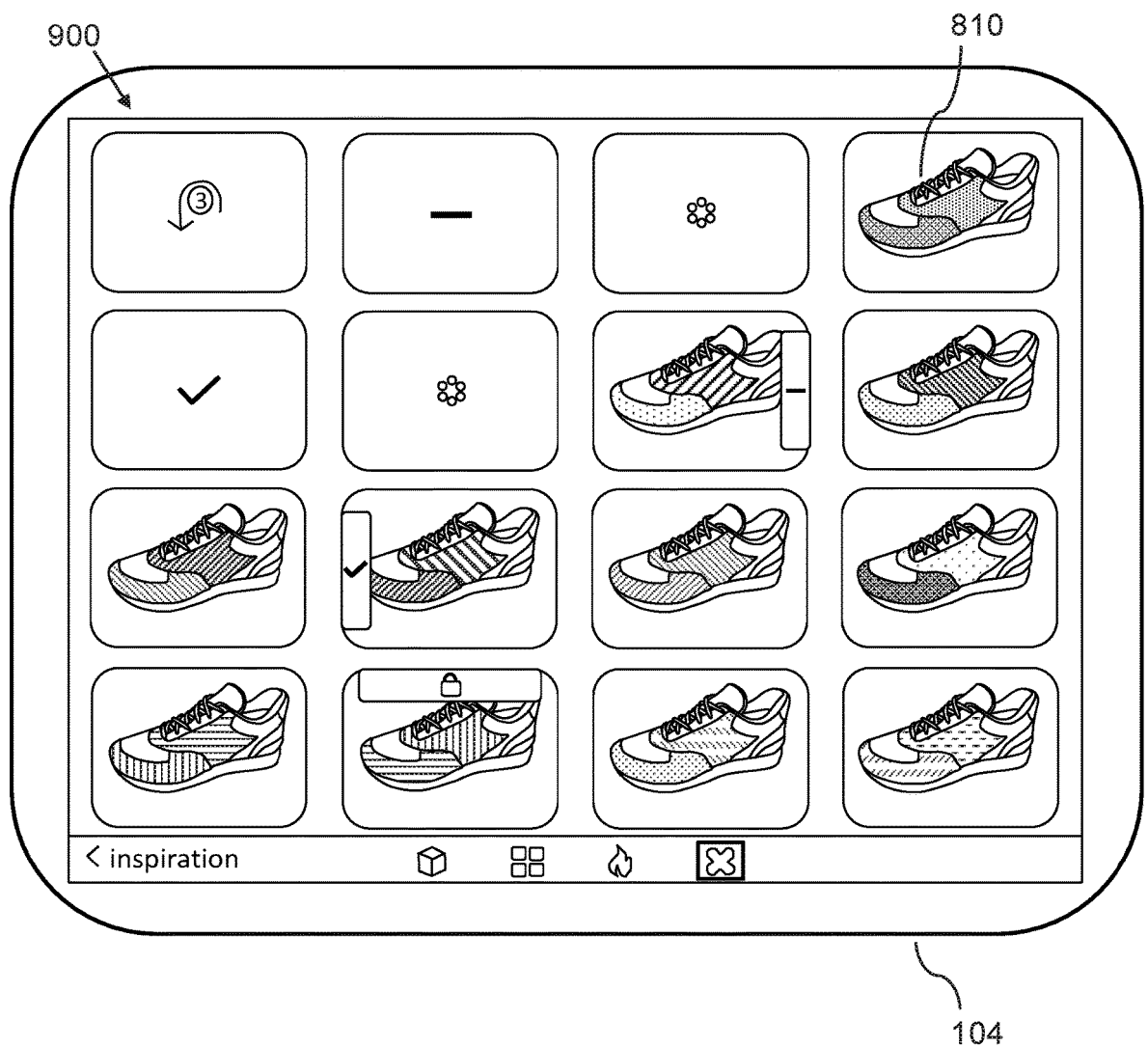
FIG. 9 is an illustration of a graphical user interface of the product configuration design device, according to an embodiment of the invention.
Figure 10:
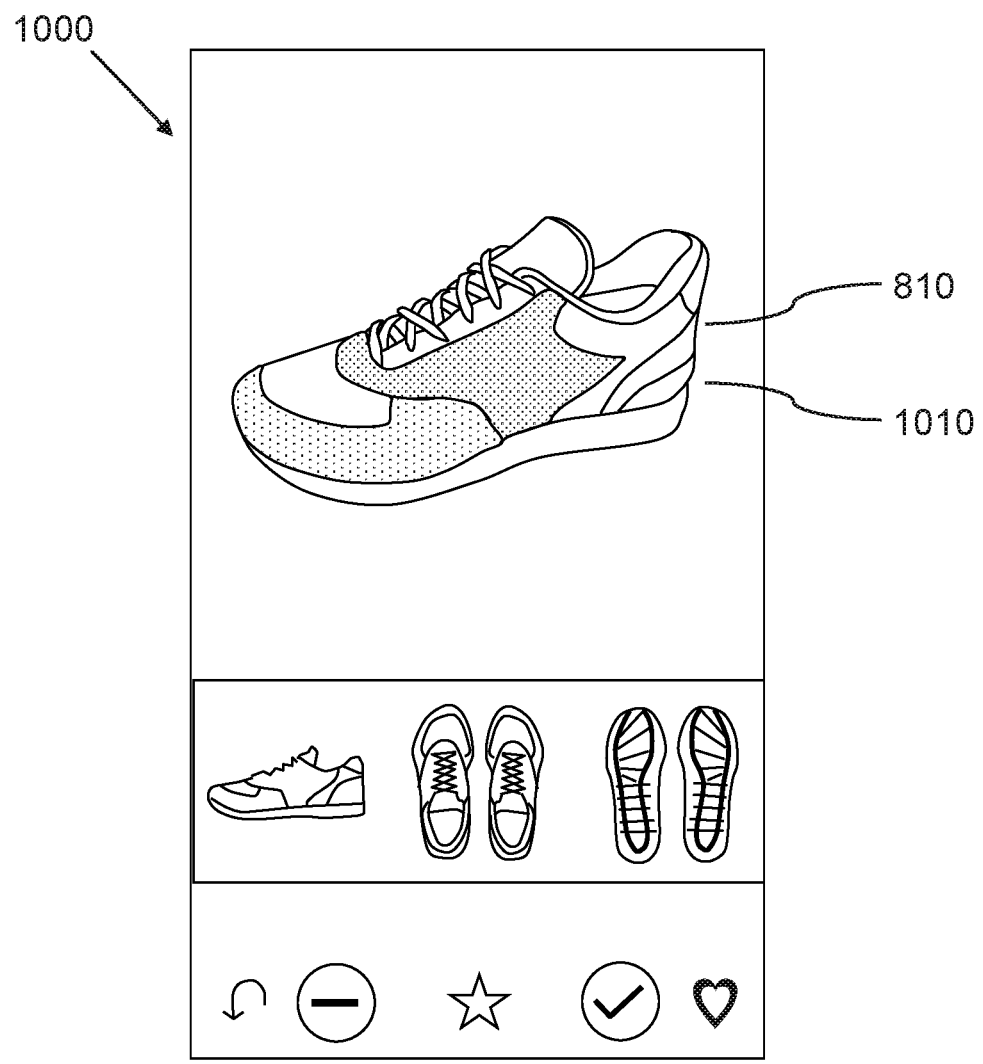
FIG. 10 is an illustration of a graphical user interface of the product configuration design device, according to an embodiment of the invention.

In a related embodiment, as shown in FIG. 9, the product editor 214 can be configured to provide a graphical user interface 900 for accepting and rejecting of results, remixing, polling, saving, such that:
  a) Accepting or rejecting of results, wherein the product editor 214 can allow the user 122 to accept or reject result configurations through either left (accept) or right (reject) swipe.
    In order to accept or reject results, the user either swipes left or right. Accepted and rejected combination will be used by the machine learner 314 for training a configuration generation model in order to deliver better, more desirable content in the future. Accepted configurations will stay as part of the results, with a green indicator to denote that the configuration is approved, while rejected results will be removed and allow for the space to be filled by a new configuration. Configurations can also not be accepted or rejected, and will therefore not be considered as input for Machine Learning. These unrated results will be overwritten during the next creation of configurations (mix) but will likely be saved as the AI/ML would likely not want to represent them again. This will move the invention away from a complete randomizer to a more intelligent system.
  b) Remixing, wherein, as shown in FIG. 9, the product editor 214 can also enable the user 122 to add a new configuration 810 to replace a rejected configuration 810. It also gives an option to restart the configuration based on the most recent input.
    Remixing means a new creation of either an individual configuration after a certain configuration has been rejected. After rejection of a certain configuration, the user can click on the icon in the empty space and create a new configuration. A completely new creation of a mix is also possible by clicking on the "mix" or "remix" icon in the toolbar on the bottom.
  c) Polling, wherein swiping from the bottom up will send a configuration to a group of people for simple voting. All votes will be taken into consideration based on which a final decision can be made by the original author.
    Users 122 can create a poll of a configuration by swiping up on the result. This will create package that can be shared with people inside or outside their organization to help rate the configuration. This rating will happen on a mobile device (or browser-based system or any electronic device) as shown in FIG. 10. Once polling is finished, the user can review poll results and then accept or reject the configuration accordingly. All accepted or rejected result including the actual polling results for a certain configuration will be stored and used for Machine Learning.
  d) Saving—Saving a configuration, invoked by swiping from the top down, which will save the current configuration, and remove it from the results
    To save configurations the user can lock a certain configuration by swiping from the top down on a single result. Saving a configuration will also affect Machine Learning, and can be weighted with a greater influence than liked or unliked configurations.

In a related embodiment, the product configuration design device 104 can be configured to display a plurality of configurations 810, such that the user 122 is enabled to accept or reject each configuration 810 in the plurality of configurations 810, such that the user identifies a plurality of accepted configurations 810 and a plurality of rejected configurations 810, which are associated with the three-dimensional object representation 400*c*, the collection 610, and the inspiration source 710.

In a related embodiment, as shown in FIG. 10, the product editor 214 can be configured to provide a graphical user interface 1000 for accepting and rejecting of results on a mobile phone. FIG. 10 illustrates the mobile phone application which allows users to review and vote on configurations that have been shared with them.

In a further related embodiment, to gain better insight on popularity and to capture third party feedback configurations, before they have been accepted or rejected by the user, configurations 810 can be shared with people inside or outside their organization. In FIG. 10 an example of an application view (which can be part of a browser or an app) is shown that shares a certain configuration with the associated 3D model. The user/recipient 122 can be able to review the 3D model with the configuration in an interactive 3D window. Alternatively, the recipient will also be able to click through saved views to quickly gain access to details the user wants to be reviewed. Using the same principle from the original application the recipient can accept or reject the configuration by swiping left or right (or tapping/selecting the accept or reject buttons). This will contribute to the polling of the configuration inside the application and will also be used by the machine learner 314 for training the configuration generation model. In addition, additional data can be captured such as age, gender and demographics to allow for more target driven design in the future.

Figure 11:
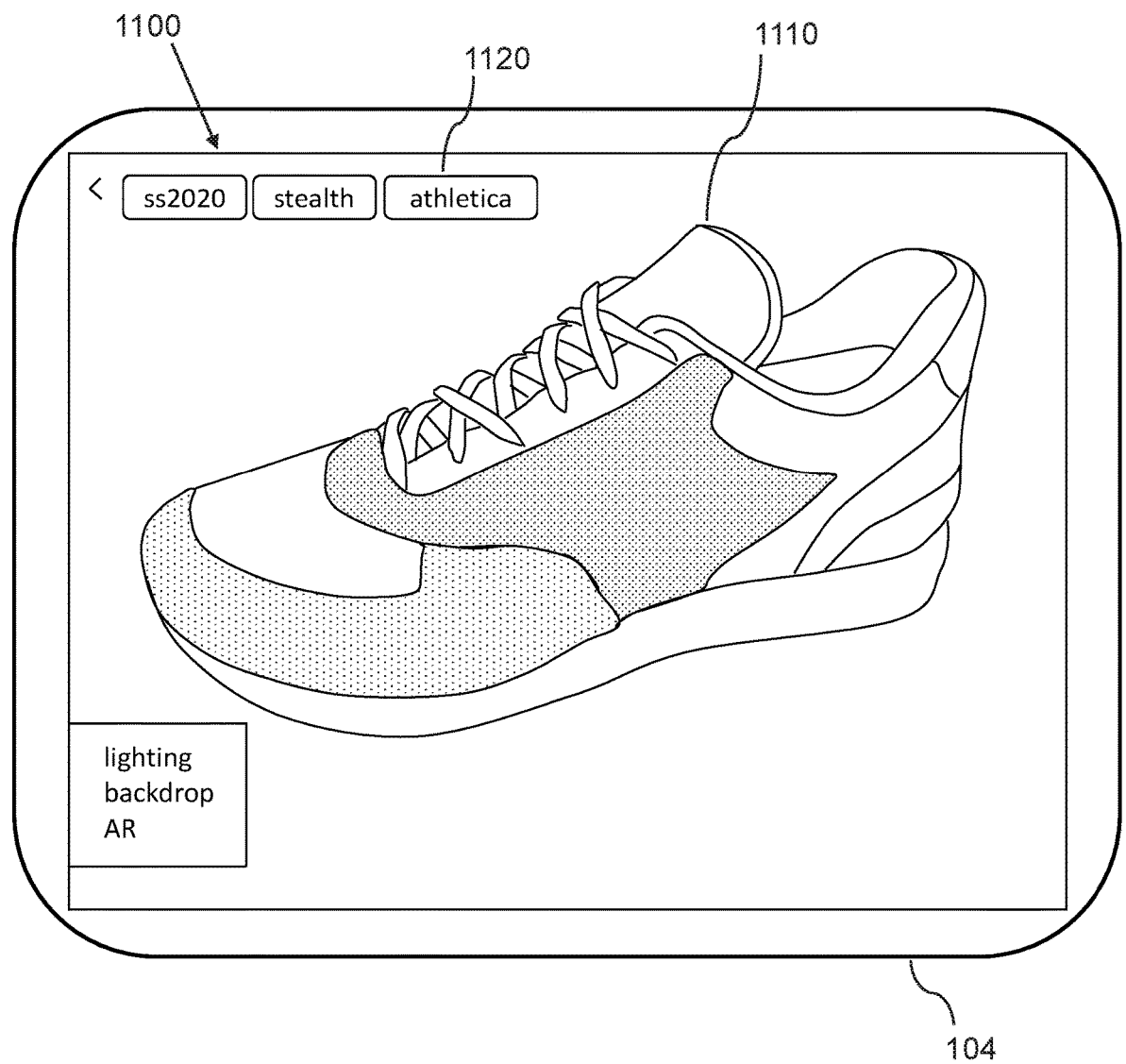
FIG. 11 is an illustration of a graphical user interface of the product configuration design device, according to an embodiment of the invention.

In a related embodiment, as shown in FIG. 11, the product visualizer 210 can be configured to provide a graphical user interface 1100 for reviewing result configurations 1110 in 3D, such that individual mix result configurations can be viewed in a fully interactive, real-time 3D environment. The tags 1120 show exactly what sources of input lead to the result. Any result can be reviewed in a 3D interactive real-time viewer. Inside the viewer the user can spin and pan the photorealistic 3D object in real-time, and zoom the camera closer to the object to review details in close-up view. To explore the behavior of the material and color configurations under different real-world lighting conditions, the user can swap out the image-based lighting environment. In addition, the user can also review the 3d object in real-world context using AR.

Figure 12:
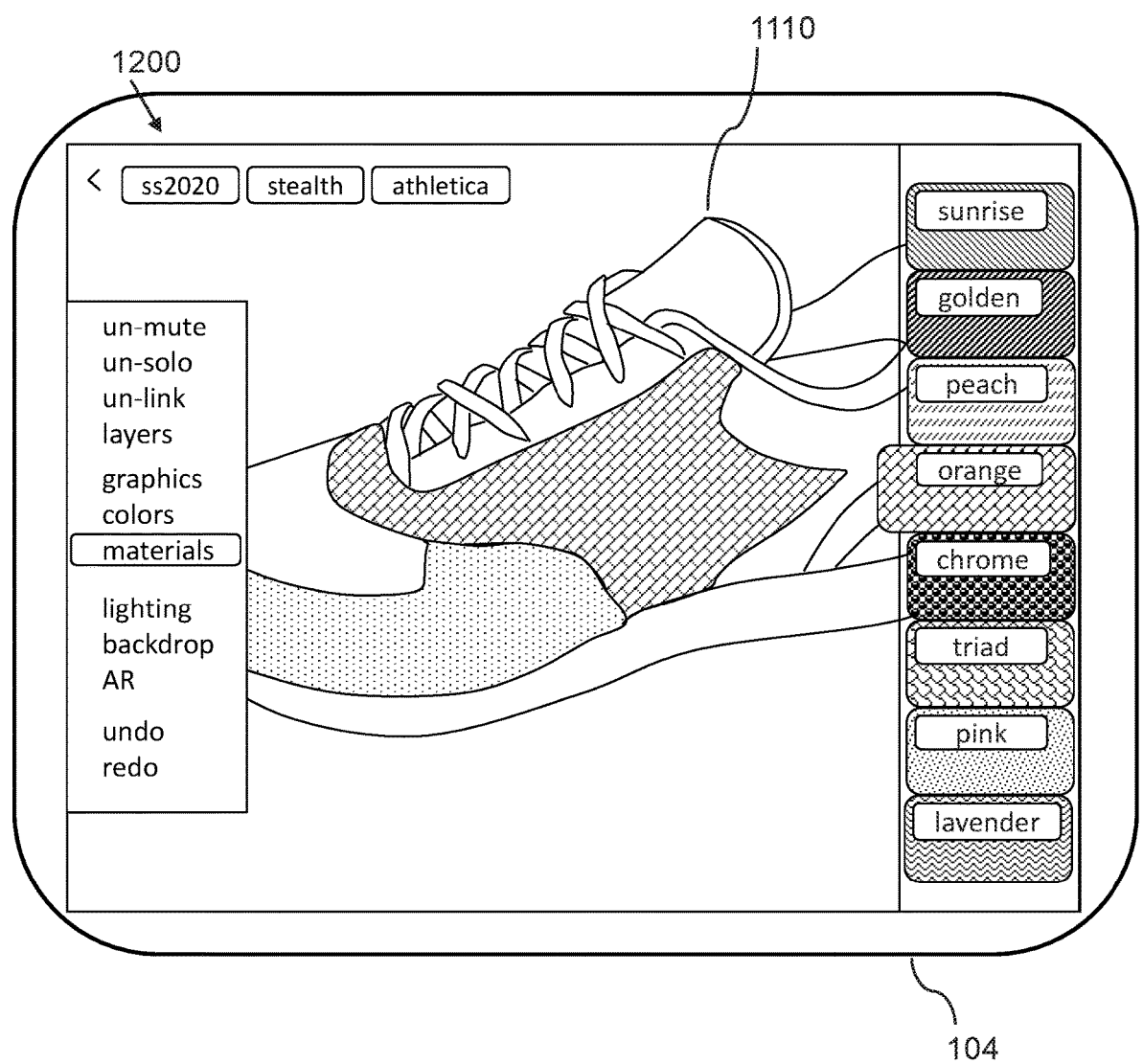
FIG. 12 is an illustration of a graphical user interface of the product configuration design device, according to an embodiment of the invention.

In a related embodiment, as shown in FIG. 12, the product visualizer 210 can be configured to provide a graphical user interface 1200 for manipulating the individual result configurations 1110. FIG. 12 shows the user interface for manual interaction with the 3D object to either start a new configuration or refine a suggested or existing configuration, thereby providing the user 122 an ability to manipulate and refine individual results. Users can choose to apply materials, colors and graphics manually to layers of the 3D object. Layers, also called regions, can then also be locked so they don't get changed during the configuration process. All of this input will then be used as input in combination with the inspiration input of various libraries to create new configurations using materials and colors from the selected collection. These manual selections can be used by the machine learner 314 for training the configuration generation model, thereby helping to define the results of configurations in the future.

In a further related embodiment, the configuration generation model 316 can be trained with the plurality of accepted configurations 810 and the plurality of rejected configurations 810, based on an input of the three-dimensional object representation 400*c*, the collection 610, and the inspiration source 710, such that the configuration generation model 316 is optimized to generate the accepted configurations 810.

In a further related embodiment, at least one accepted configuration 810 in the plurality of accepted configurations 810 can include the three-dimensional object representation 400*c*, which comprises a plurality of regions 410, such that for each region a corresponding material representation 400*b* with a corresponding color combination is applied, wherein the plurality of regions 410, comprises at least one locked region 410, which is applied with a locked material representation 400*b* with a locked color combination, such that the configuration generation model 316 is trained to only output product configurations 810 wherein the at least one locked region 410 is associated with the locked material representation 400*b* with the locked color combination.

Figure 13:
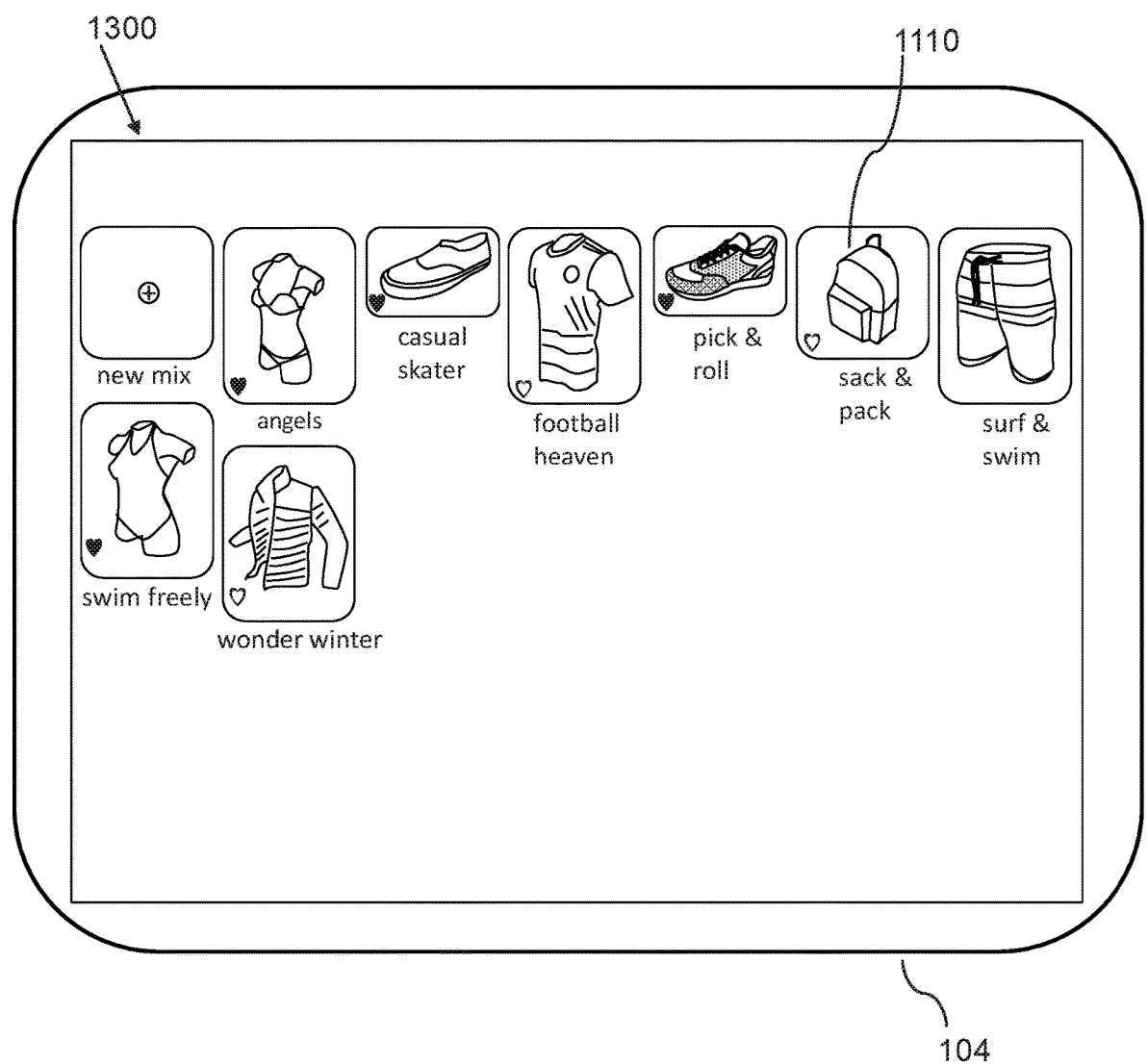
FIG. 13 is an illustration of a graphical user interface of the product configuration design device, according to an embodiment of the invention.

In a related embodiment, as shown in FIG. 13, the product visualizer 210 can be configured to provide a graphical user interface 1300 for reviewing all individual configurations (mixes). The graphical user interface 1300 illustrates a representation of all the saved configurations 1110. Any of the saved configurations 1110 can be opened and reviewed, with individual configuration to be opened in the 3D real-time interactive window for review, presentation and refinement. All results of various mixes are saved and stored locally and will be synced with the swatchbook database. Mixes can also be shared with other people inside the organization for further review and collaboration. From the collection of mixes, the user can invoke actions directly on individual mixes such as polling, sharing and collaborating.

Thus, in various related embodiments, the product configuration design system 100 can provide:
  a) A new type of design tool that combines a traditional design configuration tool with artificial intelligence (AI) and machine learning (ML);
  b) An AI engine that is feeding off a library of materials and colors, and input from custom image collection stored in the cloud, on a computer, or on social media;
  c) A system that is taught by collected images, trends, acceptance and rejections of certain color and material combinations;
  d) An automated configurator that applies materials and combination of materials and colors using AI by looking at images and collections on INSTAGRAM™, FACEBOOK™, PININTEREST™ and more;

e) An automated configurator that can be used in full or partial automation mode by allowing the user to look down one or multiple parts on the object;

f) A design tool that can be taught by using ML based on liking, disliking, and saving material/color combinations, resulting in more desired automated design combinations based on learned selections;

g) An AI based material and color configurator using additional parameters such as region, age, gender and more;

h) A smart way using AI of applying materials based on their type and tags, and use on certain parts of object. (e.g. rubber only goes on sole, no fabric on sole);

i) A new way of capturing trend data using ML;

j) Using a manual selection method of assigning and locking data to further guide and train ML;

k) Sharing of configurations to validate selected combinations with people outside the organization on a mobile device, providing further input to ML; and l) The potential use of guided ML vs directed ML vs freeform ML or any and all combinations of such ML driven processes.

In related embodiments, the product visualizer 210 can be configured to allow a user to apply 2D images to 3D objects via a tagging system, in order to interactively visualize the image in combination with simulated real-world materials under simulated lighting conditions. The combination of images and digital materials can be saved into an image library 212 for further inspiration, review, refinement, new material development in cooperation with material suppliers. Furthermore, any material stored in the online library can be viewed by simple addition of smart-tags that are associated with 3D models, and associated color ranges of the material can be visualized. The functionality provided includes:

a) A tagging system that is fully customizable, allowing users to define and set up context sensitive tags where a tag exposes a relevant collection of sub-tags. The tagging system can have an unbounded depth of sub-tags;

b) Tags that can be associated with a 3D object/model;

c) An application that allows users to visualize 2D images on 3D models through simple tagging;

d) A way of visualizing color ranges of materials on a 3D model;

e) An interactive viewing application for mobile devices; and f) An interactive view for new material development using mobile devices.

In a related embodiment, the product visualizer 210 of the product configuration design device 104 can be configured to overlay a digital material representation 400*b* of a physical sample 400*a* onto the digital product model/representation 400*c*, in order to generate a digital product rendering 1010, as for example shown in FIG. 10, such that the digital product rendering 1010 can be viewed by the user 122. The product visualizer 210 can be configured to generate views with lighting shadowing and depth of field, to simulate the appearance of a physical product.

Figure 14:
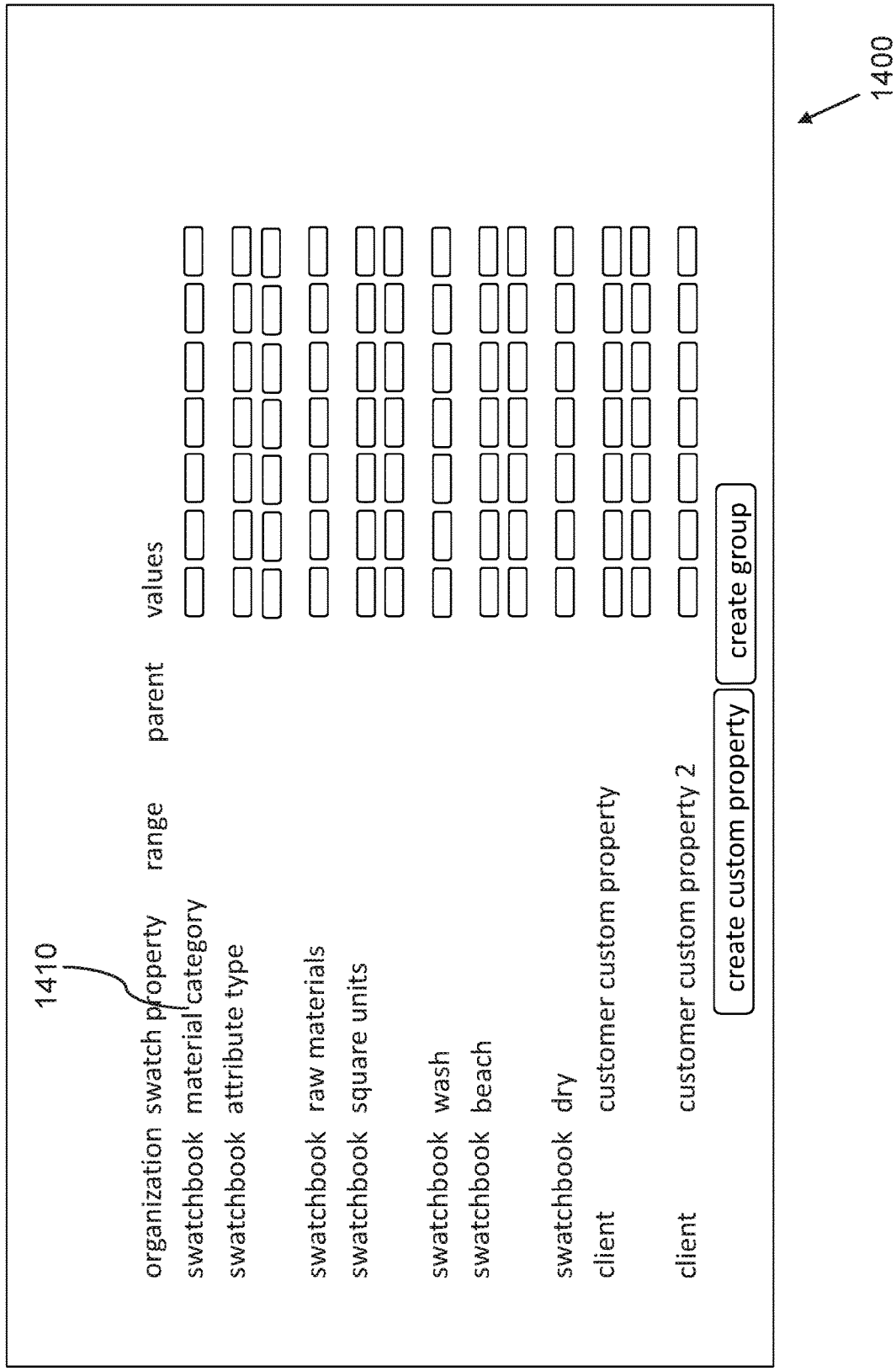
FIG. 14 is an illustration of a graphical user interface of the product configuration design device, according to an embodiment of the invention.

In a related embodiment, as illustrated in FIG. 14, the product visualizer 210 can be configured with an application view for smart tag creation 1400, to allow a user to set up smart tags 1410 according to a customizable tagging system. The customizable tagging system allows for creation of tags, which are context sensitive, such that the tagging system allows for defining dependencies of tags, within a tag taxonomy/hierarchy, such that tags can be parent tags, which can be associated with specific sub-tags that apply to such particular parent tag. A sub-tag can belong to multiple parent tags. A sub-tag can act as a parent tag to other sub-tags. The dependencies, referred to as "depth", can be unbounded, such that a user 122 can set up as many levels of sub-tags as desired. A tagging system or subset of a tagging system can be set up for a manufacturer/make, and its associated brands, and models. A master/parent tag for a particular brand, can for example have a footwear sub-tag, which has the further sub-tags {athletic men, athletic women, casual men, casual women, formal men, formal woman}, each of which has an associated set of model sub-tags, each of which are associated with at least one 3D model.

In a related embodiment, a smart tag can be associated with a a) numerical value;

b) numerical range;

c) text descriptor; and/or d) a 3D object shape representation.

In a related embodiment, the 3D object 400*c* may define/include separate material surfaces/regions 410 of the 3D object 400*c*, which can represent separate fabric cuts, or areas to which the material representation 400*b* can be applied. For a shoe, for example, certain surfaces 410 may have a material 400*b*, such as fabric or leather applied, while other areas, such as the sole may not have the material 400*b* applied.

Figure 15:
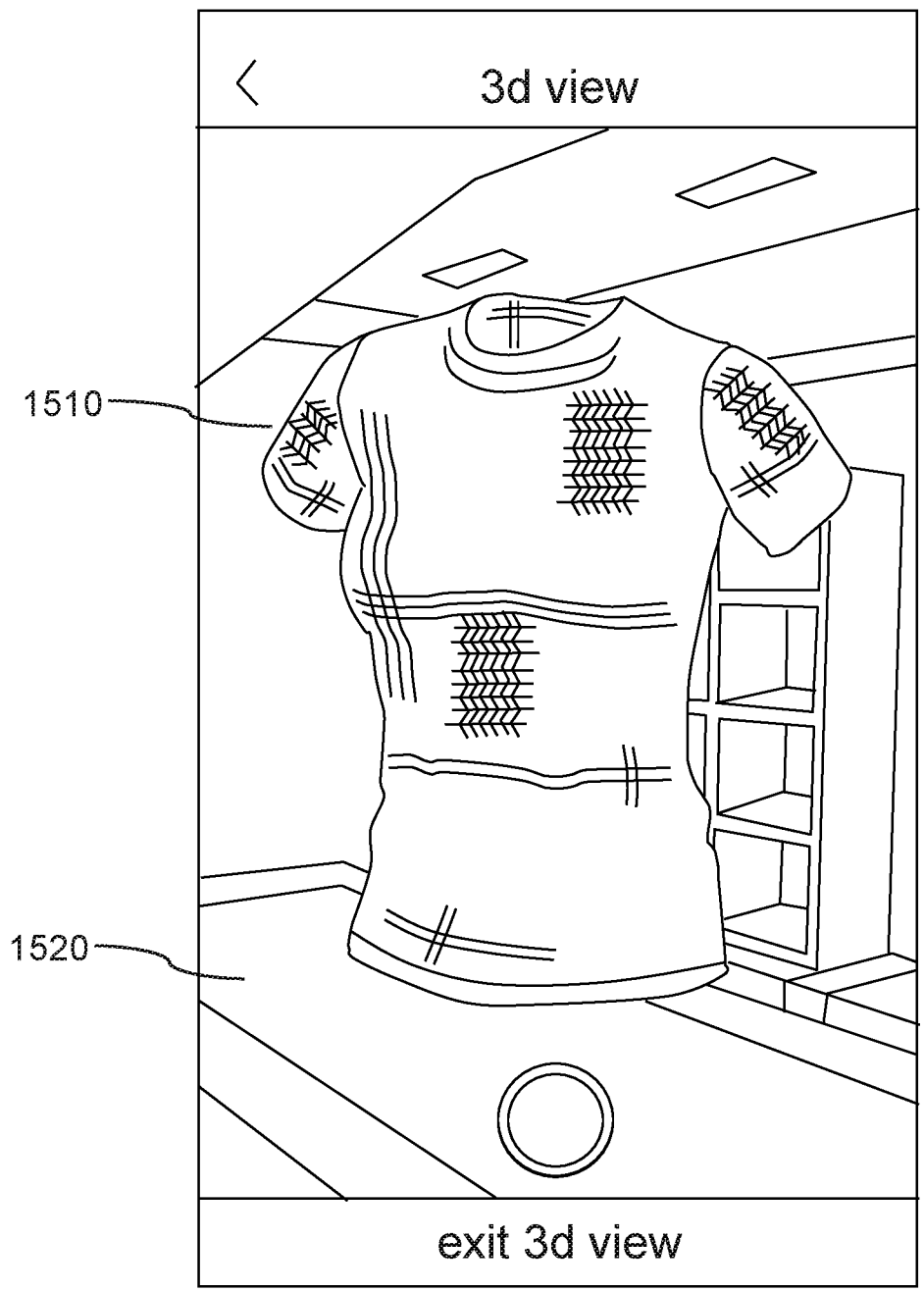
FIG. 15 is an illustration of a graphical user interface of the product configuration design device, according to an embodiment of the invention.

In a related embodiment, as shown in FIG. 15, the product visualizer 210 can be configured to show a result design configuration 1510 in an augmented reality/virtual reality (AR/VR) environment 1520. The AR/VR environment can be accessed by clicking on an icon. The interaction with the camera 207 can be specific to the AR/VR controls provided by a toolkit/API used to render the AR/VR environment. In AR/VR mode, users will still be able to edit the image on the object, as shown in FIGS. 11 and 12.

In another related embodiment, the customizable tagging system can include a hierarchy of tags, such that each tag in the hierarchy of tags is associated with at least one three-dimensional object.

In yet a related embodiment, the customizable tagging system can include a hierarchy of tags, comprising at least one parent tag, which is associated with a plurality of sub-tags.

In yet a related embodiment, the associated three-dimensional object can include a plurality of material surfaces, such that the two-dimensional material sample is applied solely to the plurality of material surfaces.

In a related embodiment, the two-dimensional material sample can be repeated in a tiled structure across the surfaces of the associated three-dimensional object.

In a related embodiment, the product visualizer can be configured to adjust a size of the two-dimensional material sample relative to the surfaces of the associated three-dimensional object.

In a related embodiment, the product visualizer can be configured to adjust a position of the two-dimensional material sample relative to the surfaces of the associated three-dimensional object.

In related embodiments, the product configuration design device 104 can be deployed as a stand-alone app, or it can be provided as part of a platform of design and manufacturing apps, such that the product configuration design system 100 is embedded within the design and manufacturing platform. The design and manufacturing platform can include other apps, including a digital material design and visualization platform with a material mix application, which can take as input a plurality of parameters (or ingredients) for a material such as base, color, pattern, coating, and develop the material on the fly based on the inputs. The material mix application can be used for new material creation, such as for material types like leather, with colors, hole patterns, with rules, and with inspiration to create new materials.

In a further related embodiment, the product configuration design device 104 can include or integrate with a dedicated rendering application for the creation of photorealistic imagery for sales, marketing and retail; such that the rendering application is either included as internal component or via integration with external rendering application or system.

Thus, in a yet further related embodiment, such a digital material design and visualization platform including the product configuration design system 100 can function as an ingredient based digital mixing platform to rapidly create variations based on rules, specifications and inspiration, wherein user voting and consumer voting feeds into a machine learning backend to guide the product creation and decision making. The ingredient based digital mixing platform can further include a photography mix application, which allows a user to select a digital asset (pre-configured), select product type, select inspiration, such that the photography mix application can provide lighting variations and camera position variation, and then proceed to polling/voting.

In an embodiment, as illustrated in FIG. 16, a method of product configuration design 1600, can include:
a) Selecting a three-dimensional object 1602, including processes as described and shown in relation to FIG. 5;
b) Selecting a collection 1604, including processes as described and shown in relation to FIG. 6;
c) Selecting an inspiration source 1606, including processes as described and shown in relation to FIG. 7;
d) Generating configurations 1608, including processes as described and shown in relation to FIG. 8, wherein a plurality of configurations are generated as an output from a machine learning calculation on a configuration generation model, which takes as input the three-dimensional object representation, the collection, and the inspiration source;
e) Accepting/rejecting result configurations 1610, including processes as described and shown in relation to FIGS. 9 and 10;
f) Reviewing result configurations 1612, including processes as described and shown in relation to FIG. 11; and
g) Editing result configurations 1614, including processes as described and shown in relation to FIG. 12.

In a related embodiment, accepting/rejecting result configurations 1610 can further include displaying the plurality of configurations, wherein a user accepts or rejects each configuration in the plurality of configurations, such that the user identifies a plurality of accepted configurations and a plurality of rejected configurations, which are associated with the three-dimensional object representation, the collection, and the inspiration source.

In a further related embodiment, the method of product configuration design 1600 can further include training 1616 the configuration generation model with the plurality of accepted configurations and the plurality of rejected configurations, based on an input of the three-dimensional object representation, the collection, and the inspiration source, such that the configuration generation model is optimized to generate the accepted configurations.

FIGS. 1, 2, 3, and 16 are block diagrams and flowcharts, methods, devices, systems, apparatuses, and computer program products according to various embodiments of the present invention. It shall be understood that each block or step of the block diagram, flowchart and control flow illustrations, and combinations of blocks in the block diagram, flowchart and control flow illustrations, can be implemented by computer program instructions or other means. Although computer program instructions are discussed, an apparatus or system according to the present invention can include other means, such as hardware or some combination of hardware and software, including one or more processors or controllers, for performing the disclosed functions.

In this regard, FIGS. 1, 2, and 3 depict the computer devices of various embodiments, each containing several of the key components of a general-purpose computer by which an embodiment of the present invention may be implemented. Those of ordinary skill in the art will appreciate that a computer can include many components. However, it is not necessary that all of these generally conventional components be shown in order to disclose an illustrative embodiment for practicing the invention. The general-purpose computer can include a processing unit and a system memory, which may include various forms of non-transitory storage media such as random-access memory (RAM) and read-only memory (ROM). The computer also may include nonvolatile storage memory, such as a hard disk drive, where additional data can be stored.

FIG. 1 shows a depiction of an embodiment of the product configuration design system 100, including the product configuration design server 102, and the product configuration design device 104. In this relation, a server shall be understood to represent a general computing capability that can be physically manifested as one, two, or a plurality of individual physical computing devices, located at one or several physical locations. A server can for example be manifested as a shared computational use of one single desktop computer, a dedicated server, a cluster of rack-mounted physical servers, a datacenter, or network of datacenters, each such datacenter containing a plurality of physical servers, or a computing cloud, such as AMAZON EC2™ or MICROSOFT AZURE™.

It shall be understood that the above-mentioned components of the product configuration design server 102 and the product configuration design device 104 are to be interpreted in the most general manner.

For example, the processors 202 302 can each respectively include a single physical microprocessor or microcontroller, a cluster of processors, a datacenter or a cluster of datacenters, a computing cloud service, and the like.

In a further example, the non-transitory memory 204 and the non-transitory memory 304 can each respectively include various forms of non-transitory storage media, including random access memory and other forms of dynamic storage, and hard disks, hard disk clusters, cloud storage services, and other forms of long-term storage. Similarly, the input/output 206 and the input/output 306 can each respectively include a plurality of well-known input/output devices, such as screens, keyboards, pointing devices, motion trackers, communication ports, and so forth.

Furthermore, it shall be understood that the product configuration design server 102 and the product configuration design device 104 can each respectively include a number of other components that are well known in the art of general computer devices, and therefore shall not be further described herein. This can include system access to common functions and hardware, such as for example via operating system layers such as WINDOWS™, LINUX™, and similar operating system software, but can also include configurations wherein application services are executing directly on server hardware or via a hardware abstraction layer other than a complete operating system.

An embodiment of the present invention can also include one or more input or output components, such as a mouse, keyboard, monitor, and the like. A display can be provided for viewing text and graphical data, as well as a user interface to allow a user to request specific operations. Furthermore, an embodiment of the present invention may be connected to one or more remote computers via a network interface. The connection may be over a local area network (LAN) wide area network (WAN) and can include all of the necessary circuitry for such a connection.

In a related embodiment, the product configuration design device 104 communicates with the product configuration design server 102 over a network 106, which can include the general Internet, a Wide Area Network or a Local Area Network, or another form of communication network, transmitted on wired or wireless connections. Wireless networks can for example include Ethernet, Wi-Fi, BLUETOOTH™, ZIGBEE™, and NFC. The communication can be transferred via a secure, encrypted communication protocol.

Typically, computer program instructions may be loaded onto the computer or other general-purpose programmable machine to produce a specialized machine, such that the instructions that execute on the computer or other programmable machine create means for implementing the functions specified in the block diagrams, schematic diagrams or flowcharts. Such computer program instructions may also be stored in a computer-readable medium that when loaded into a computer or other programmable machine can direct the machine to function in a particular manner, such that the instructions stored in the computer-readable medium produce an article of manufacture including instruction means that implement the function specified in the block diagrams, schematic diagrams or flowcharts.

In addition, the computer program instructions may be loaded into a computer or other programmable machine to cause a series of operational steps to be performed by the computer or other programmable machine to produce a computer-implemented process, such that the instructions that execute on the computer or other programmable machine provide steps for implementing the functions specified in the block diagram, schematic diagram, flowchart block or step.

Accordingly, blocks or steps of the block diagram, flowchart or control flow illustrations support combinations of means for performing the specified functions, combinations of steps for performing the specified functions and program instruction means for performing the specified functions. It will also be understood that each block or step of the block diagrams, schematic diagrams or flowcharts, as well as combinations of blocks or steps, can be implemented by special purpose hardware-based computer systems, or combinations of special purpose hardware and computer instructions, that perform the specified functions or steps.

As an example, provided for purposes of illustration only, a data input software tool of a search engine application can be a representative means for receiving a query including one or more search terms. Similar software tools of applications, or implementations of embodiments of the present invention, can be means for performing the specified functions. For example, an embodiment of the present invention may include computer software for interfacing a processing element with a user-controlled input device, such as a mouse, keyboard, touch screen display, scanner, or the like. Similarly, an output of an embodiment of the present invention may include, for example, a combination of display software, video card hardware, and display hardware. A processing element may include, for example, a controller or microprocessor, such as a central processing unit (CPU), arithmetic logic unit (ALU), or control unit.

Here has thus been described a multitude of embodiments of the product configuration design system 100, the product configuration design device 104, and methods related thereto, which can be employed in numerous modes of usage.

The many features and advantages of the invention are apparent from the detailed specification, and thus, it is intended by the appended claims to cover all such features and advantages of the invention, which fall within the true spirit and scope of the invention.

For example, alternative embodiments can reconfigure or combine the components of the product configuration design server 102 and the product configuration design device 104. The components of the product configuration design server 102 can be distributed over a plurality of physical, logical, or virtual servers. Parts or all of the components of the product configuration design device 104 can be configured to operate in the product configuration design server 102, whereby the product configuration design device 104 for example can function as a thin client, performing only graphical user interface presentation and input/output functions. Alternatively, parts or all of the components of the product configuration design server 102 can be configured to operate in the product configuration design device 104.

Many such alternative configurations are readily apparent and should be considered fully included in this specification and the claims appended hereto. Accordingly, since numerous modifications and variations will readily occur to those skilled in the art, the invention is not limited to the exact construction and operation illustrated and described, and thus, all suitable modifications and equivalents may be resorted to, falling within the scope of the invention.

What is claimed is:

1. A product configuration design system, comprising:
a) a product configuration design server, comprising a configuration generation model, wherein the product configuration design server comprises:
a processor;
a non-transitory memory;
an input/output component; and
a machine learner, which is configured to process a machine learning algorithm for training and executing the configuration generation model;
all connected via
a data bus; and
b) a product configuration design device, such that the product configuration design device is connected to the product configuration design server;
wherein the product configuration design device is configured to enable a user to select a three-dimensional object representation, a collection, and an inspiration source;
such that the product configuration design server generates a plurality of product configurations as an output from a machine learning calculation on the configuration generation model, which takes as input the three-dimensional object representation, the collection, and the inspiration source;

wherein the product configuration design device is configured to display the plurality of product configurations simultaneously, such that the user is enabled to accept or reject each product configuration in the plurality of product configurations, such that the user identifies a plurality of accepted configurations and a plurality of rejected configurations, which are associated with the three-dimensional object representation, the collection, and the inspiration source;

wherein the configuration generation model is trained with the plurality of accepted configurations and the plurality of rejected configurations, based on an input of the three-dimensional object representation, the collection, and the inspiration source, such that the configuration generation model is optimized to generate the accepted configurations; and wherein at least one accepted configuration in the plurality of accepted configurations comprises the three-dimensional object representation, which comprises a plurality of regions, such that for each region a corresponding material representation with a corresponding color combination is applied, wherein the plurality of regions, comprises at least one locked region, which is applied with a locked material representation with a locked color combination, such that the configuration generation model is trained to only output product configurations wherein the at least one locked region is associated with the locked material representation with the locked color combination.

2. The product configuration design system of claim 1, wherein the collection comprises a plurality of materials and a plurality of colors.

3. The product configuration design system of claim 1, wherein the inspiration source comprises a plurality of images.

4. The product configuration design system of claim 1, wherein each product configuration in the plurality of product configurations comprises the three-dimensional object representation, which comprises a plurality of regions, such that for each region a corresponding material representation with a corresponding color combination is applied.

5. The product configuration design system of claim 1, wherein the configuration generation model is a convolutional artificial neural network with at least two hidden layers.

6. The product configuration design system of claim 1, wherein the product configuration design server further comprises:
a product storage, for storing a customizable tagging system, comprising a hierarchy of tags, such that each tag is associated with at least one three-dimensional object.

7. A method of product configuration design, comprising:
a) selecting a three-dimensional object representation;
b) selecting a collection;
c) selecting an inspiration source; and
d) generating a plurality of product configurations, wherein the plurality of product configurations are generated as an output from a machine learning calculation on a configuration generation model, which takes as input the three-dimensional object representation, the collection, and the inspiration source;
e) displaying the plurality of product configurations simultaneously, wherein a user accepts or rejects each product configuration in the plurality of product configurations, such that the user identifies a plurality of accepted configurations and a plurality of rejected configurations, which are associated with the three-dimensional object representation, the collection, and the inspiration source; and
f) training the configuration generation model with the plurality of accepted configurations and the plurality of rejected configurations, based on an input of the three-dimensional object representation, the collection, and the inspiration source, such that the configuration generation model is optimized to generate the accepted configurations;

wherein at least one accepted configuration in the plurality of accepted configurations comprises the three-dimensional object representation, which comprises a plurality of regions, such that for each region a corresponding material representation with a corresponding color combination is applied, wherein the plurality of regions, comprises at least one locked region, which is applied with a locked material representation with a locked color combination, such that the configuration generation model is trained to only output product configurations wherein the at least one locked region is associated with the locked material representation with the locked color combination.

8. The method of product configuration design of claim 7, wherein the collection comprises a plurality of materials and a plurality of colors.

9. The method of product configuration design of claim 7, wherein the inspiration source comprises a plurality of images.

10. The method of product configuration design of claim 7, wherein each product configuration in the plurality of product configurations comprises the three-dimensional object representation, which comprises a plurality of regions, such that for each region a corresponding material representation with a corresponding color combination is applied.

11. The method of product configuration design of claim 7, wherein the configuration generation model is a convolutional artificial neural network with at least two hidden layers.

* * * * *